United States Patent
Liu et al.

(10) Patent No.: US 12,004,410 B2
(45) Date of Patent: Jun. 4, 2024

(54) OPTICAL SYSTEM INCLUDING LIGHT CONTROL FILM AND FRESNEL LENS

(71) Applicant: 3M INNOVATIVE PROPERTIES COMPANY, St. Paul, MN (US)

(72) Inventors: Tao Liu, Woodbury, MN (US); Gary T. Boyd, Woodbury, MN (US); Daniel J. Schmidt, Woodbury, MN (US); Caleb T. Nelson, McKinney, TX (US); Owen M. Anderson, Minneapolis, MN (US); Tri D. Pham, Woodbury, MN (US); Encai Hao, Woodbury, MN (US); Shu-Ching Fan, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 17/768,421

(22) PCT Filed: Oct. 29, 2020

(86) PCT No.: PCT/IB2020/060183
§ 371 (c)(1),
(2) Date: Apr. 12, 2022

(87) PCT Pub. No.: WO2021/090129
PCT Pub. Date: May 14, 2021

(65) Prior Publication Data
US 2024/0122043 A1   Apr. 11, 2024

Related U.S. Application Data

(60) Provisional application No. 62/932,673, filed on Nov. 8, 2019.

(51) Int. Cl.
*G02B 3/08*   (2006.01)
*H10K 59/80*   (2023.01)

(52) U.S. Cl.
CPC ............. *H10K 59/879* (2023.02); *G02B 3/08* (2013.01)

(58) Field of Classification Search
CPC ................................ H10K 59/879; G02B 3/08
(Continued)

(56) References Cited

U.S. PATENT DOCUMENTS

| | | |
|---|---|---|
| 3,972,593 A | 8/1976 | Appeldorn et al. |
| 5,175,030 A | 12/1992 | Lu et al. |

(Continued)

FOREIGN PATENT DOCUMENTS

| | | |
|---|---|---|
| CN | 208521047 U | 2/2019 |
| JP | 2007183389 A | 7/2007 |

(Continued)

OTHER PUBLICATIONS

International Search report for PCT International Application No. PCT/IB2020/060183 dated Jan. 26, 2021, 3 pages.

(Continued)

*Primary Examiner* — Christopher M Raabe
(74) *Attorney, Agent, or Firm* — Clifton F. Richardson

(57) ABSTRACT

An optical system includes a light source, an optical film curved about a first axis, and a light control film curved about the first axis and disposed between the light source and the optical film. The optical film includes a microstructured first major surface and an opposing second major surface. The microstructured first major surface defines a linear Fresnel lens including a plurality of Fresnel elements extending longitudinally along the first axis. The first major surface of the optical film faces the light control film. The light control film includes a plurality of alternating optically transmissive and optically absorptive regions extending longitudinally along the first axis such that in a cross-section orthogonal to the first axis, for at least a majority of the (Continued)

optically transmissive regions, a centerline between adjacent optically absorptive regions is substantially normal to a major surface of the light control film.

15 Claims, 13 Drawing Sheets

(58) Field of Classification Search
USPC .................................................. 362/628
See application file for complete search history.

(56) References Cited

U.S. PATENT DOCUMENTS

| | | |
|---|---|---|
| 5,183,597 A | 2/1993 | Lu |
| 6,407,859 B1 | 6/2002 | Hennen et al. |
| 6,417,966 B1 | 7/2002 | Moshrefzadeh et al. |
| 8,213,082 B2 | 7/2012 | Gaides et al. |
| 8,234,998 B2 | 8/2012 | Krogman et al. |
| 8,313,798 B2 | 11/2012 | Nogueira et al. |
| 8,460,568 B2 | 6/2013 | David et al. |
| 8,780,300 B2 | 7/2014 | Niioka et al. |
| 8,808,811 B2 | 8/2014 | Kolb et al. |
| 9,063,284 B2 | 6/2015 | Jones et al. |
| 9,335,449 B2 | 5/2016 | Gaides et al. |
| 10,365,415 B2 | 7/2019 | Schmidt |
| 2006/0114569 A1 | 6/2006 | Capaldo et al. |
| 2006/0291243 A1 | 12/2006 | Niioka et al. |
| 2009/0059126 A1 | 3/2009 | Koganezawa |
| 2011/0064936 A1 | 3/2011 | Cunningham et al. |
| 2011/0304916 A1 | 12/2011 | Ushigome |
| 2012/0319999 A1* | 12/2012 | Kamiya ................ G06F 3/0425 345/173 |
| 2013/0273242 A1 | 10/2013 | Krogman et al. |
| 2019/0049632 A1* | 2/2019 | Shin ....................... G02B 21/34 |
| 2020/0012017 A1 | 1/2020 | Shimoda |

FOREIGN PATENT DOCUMENTS

| | | |
|---|---|---|
| JP | 2015075535 A | 4/2015 |
| JP | 2015075635 A | 4/2015 |
| JP | 5970920 B2 | 8/2016 |
| JP | 2016176981 A | 10/2016 |
| WO | 2018129073 A1 | 7/2018 |
| WO | 2019118685 A1 | 6/2019 |
| WO | 2019135190 A1 | 7/2019 |
| WO | 2020026139 A1 | 2/2020 |
| WO | 2020261027 A1 | 12/2020 |
| WO | 2021090130 A1 | 5/2021 |

OTHER PUBLICATIONS

Mohon et al., Fresnel Lens in an Improved Infinity Image Display System, U.S. Statutory Invention Registration H423, Feb. 2, 1988, 5 pages.

* cited by examiner

OPTICAL SYSTEM INCLUDING LIGHT CONTROL FILM AND FRESNEL LENS

CROSS REFERENCE TO RELATED APPLICATIONS

This application is a national stage filing under 35 U.S.C. 371 of PCT/IB2020/060183, filed Oct. 29, 2020, which claims the benefit of Provisional Application No. 62/932,673, filed Nov. 8, 2019, the disclosures of which are incorporated by reference in their entirety herein.

BACKGROUND

A light control film can include alternating optically transmissive and optically absorptive regions and can be used to regulate the directionally of light transmitted through the film.

A display surface can be curved.

SUMMARY

In some aspects, the present disclosure provides an optical system including a light source, an optical film curved about a first axis, and a light control film curved about the first axis and disposed between the light source and the optical film. The optical film includes a microstructured first major surface and an opposing second major surface. The microstructured first major surface defines a linear Fresnel lens including a plurality of Fresnel elements extending longitudinally along the first axis. The first major surface of the optical film faces the light control film. The light control film includes a plurality of alternating optically transmissive and optically absorptive regions extending longitudinally along the first axis such that in a cross-section orthogonal to the first axis, for at least a majority of the optically transmissive regions, a centerline between adjacent optically absorptive regions is substantially normal to a major surface of the light control film.

In some aspects, the present disclosure provides an optical system including an optical film curved about a first axis and a light control film curved about the first axis and disposed proximate the optical film. The optical film includes a microstructured first major surface and an opposing second major surface. The microstructured first major surface defines a linear Fresnel lens including a plurality of Fresnel elements extending longitudinally along the first axis. Each Fresnel element includes an optical facet and a sidewall meeting the optical facet at a ridge of the Fresnel element. For each Fresnel element in at least a majority of the Fresnel elements, an optically absorptive layer can be disposed on and substantially cover the sidewall. The optically absorptive layer can have an average thickness t, where 100 nm<t<1 micrometer. The first major surface of the optical film faces the light control film. The light control film includes a plurality of alternating optically transmissive and optically absorptive regions extending longitudinally along the first axis such that in a cross-section orthogonal to the first axis, for at least a majority of the optically transmissive regions, a centerline between adjacent optically absorptive regions is substantially normal to a major surface of the light control film.

DETAILED DESCRIPTION

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

A light control film, which may also be referred to as a collimating film or a privacy filter, can be used to regulate the directionally of light transmitted through the film. A light control film can be placed on a curved display, for example, to filter the light output of the display. However, it is typically desired to alter the directionality of the transmitted light compared to using a traditional light control film placed onto the curved display surface (e.g., so that light is directed primarily toward a viewer rather than primarily along a normal to the display surface). This can be done by altering the tilt of the louvers (e.g., light absorptive regions) of the light control film as described in U.S. Pat. Appl. No. 62/865,510 filed on Jun. 24, 2019 and titled "Curved Display with Light Control Film". Alternatively, a linear Fresnel lens may be placed on a conventional light control film to alter the directionality of the transmitted light. However, it has been found that this can result in an undesired bright band at higher view angles. According to some embodiments of the present description, it has been found that a Fresnel lens can be positioned in an optical system such that the Fresnel elements face the light control film, and this can reduce or substantially eliminate the bright band at higher view angles.

Further, it has been found according to some embodiments, that an optically absorptive layer can be disposed on the sidewalls of the Fresnel elements to reduce undesired redirection of light by the sidewalls. Utilizing thin optically absorptive layers has been found to reduce undesired effects (e.g., blocking light incident on an edge of the layer that would be desired to be transmitted) of the optically absorptive layers. When the optically absorptive layer is thin, it preferably has a relatively high extinction coefficient in order to efficiently absorb light. In some cases, the high extinction coefficient can produce a reflective, metal-like interface with the sidewall. It has been found that adding a cladding layer (e.g., a layer having an extinction coefficient less than that of the optically absorptive layer and greater than that of the sidewall material) between a high extinction coefficient absorbing layer and the sidewall can reduce reflectivity and thereby reduce undesired light redirection by the sidewalls.

Figure 1:
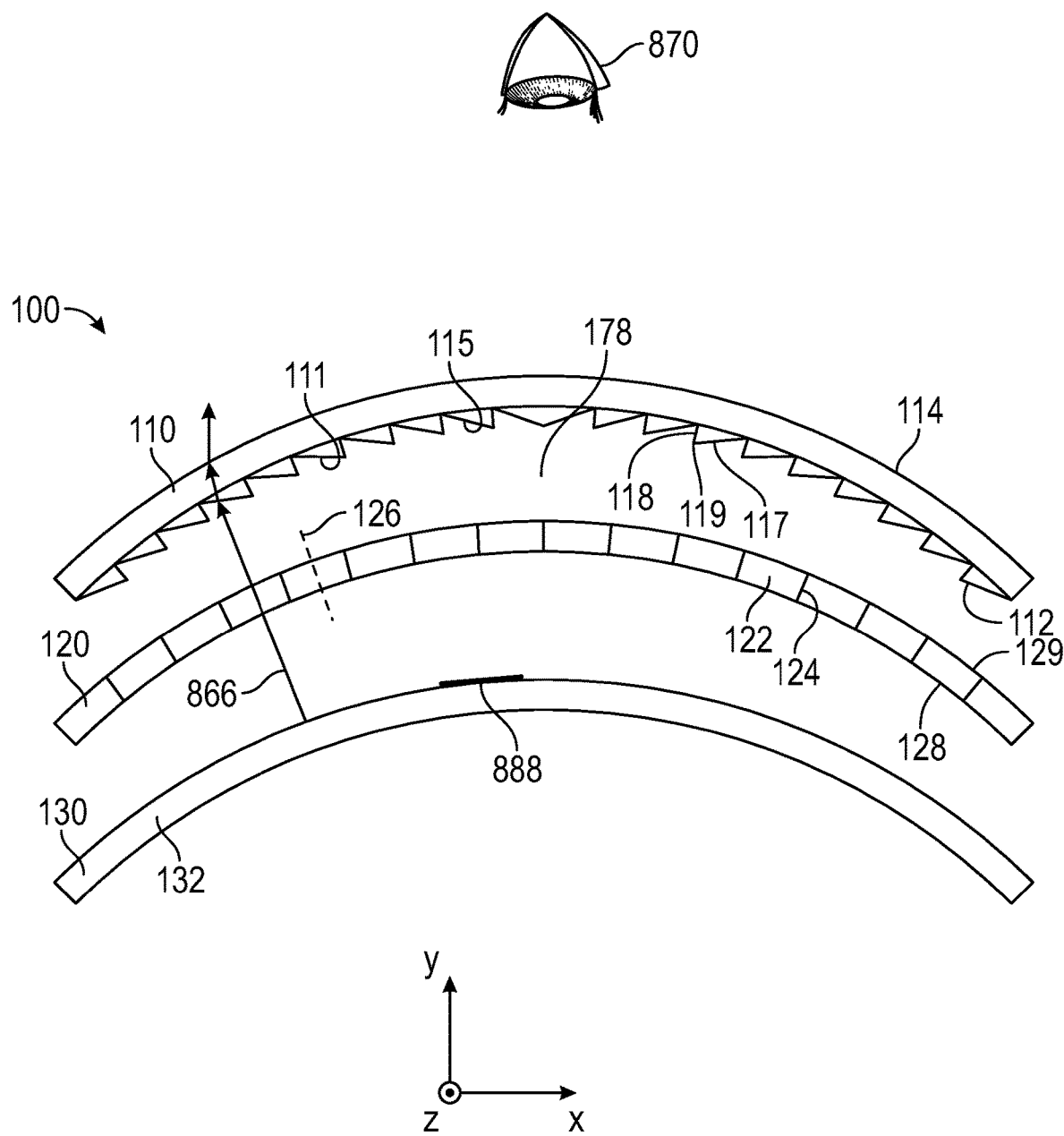
FIGS. 1-3 are schematic cross-sectional views of optical systems.
Figure 2:
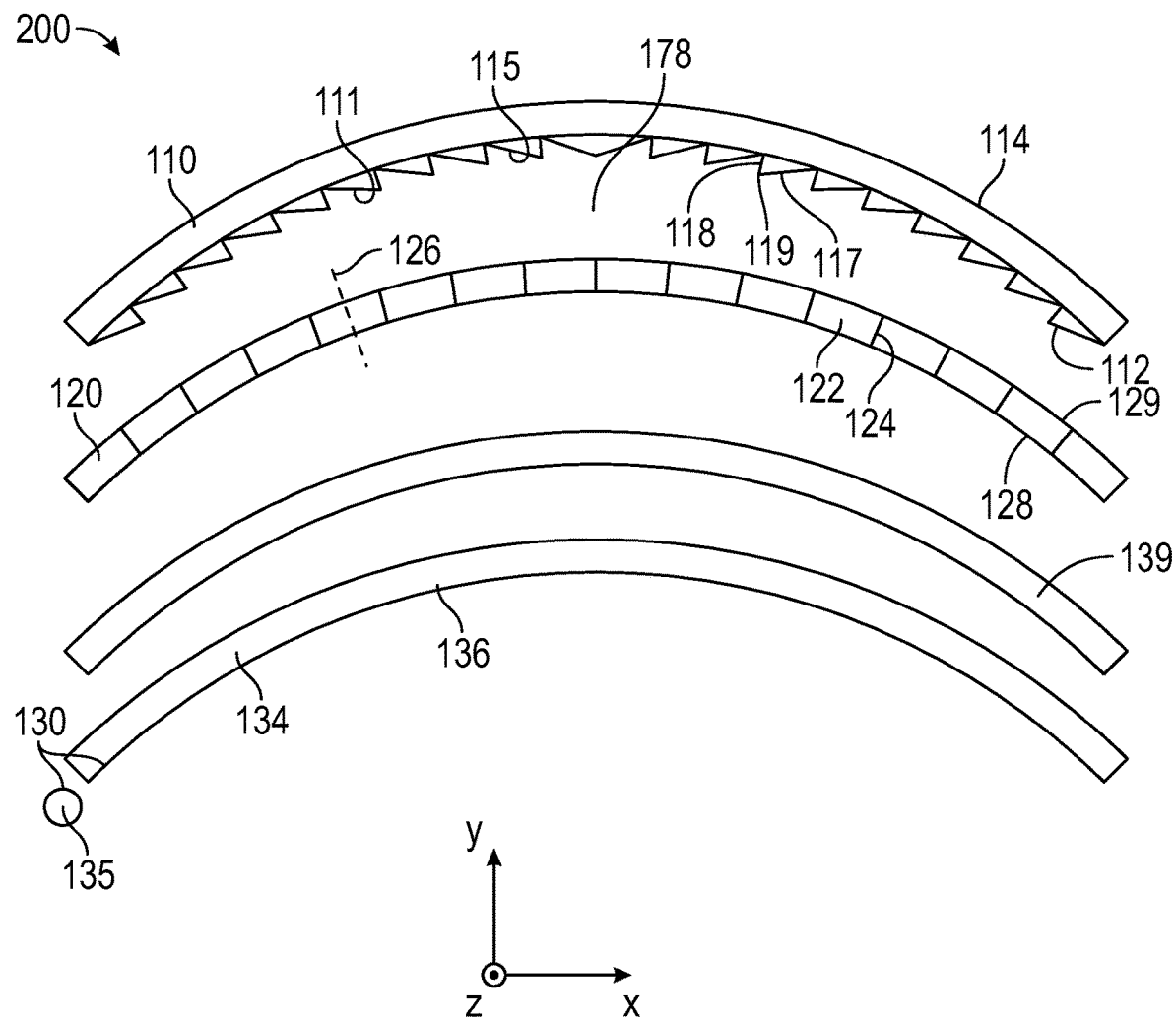
Figure 3:
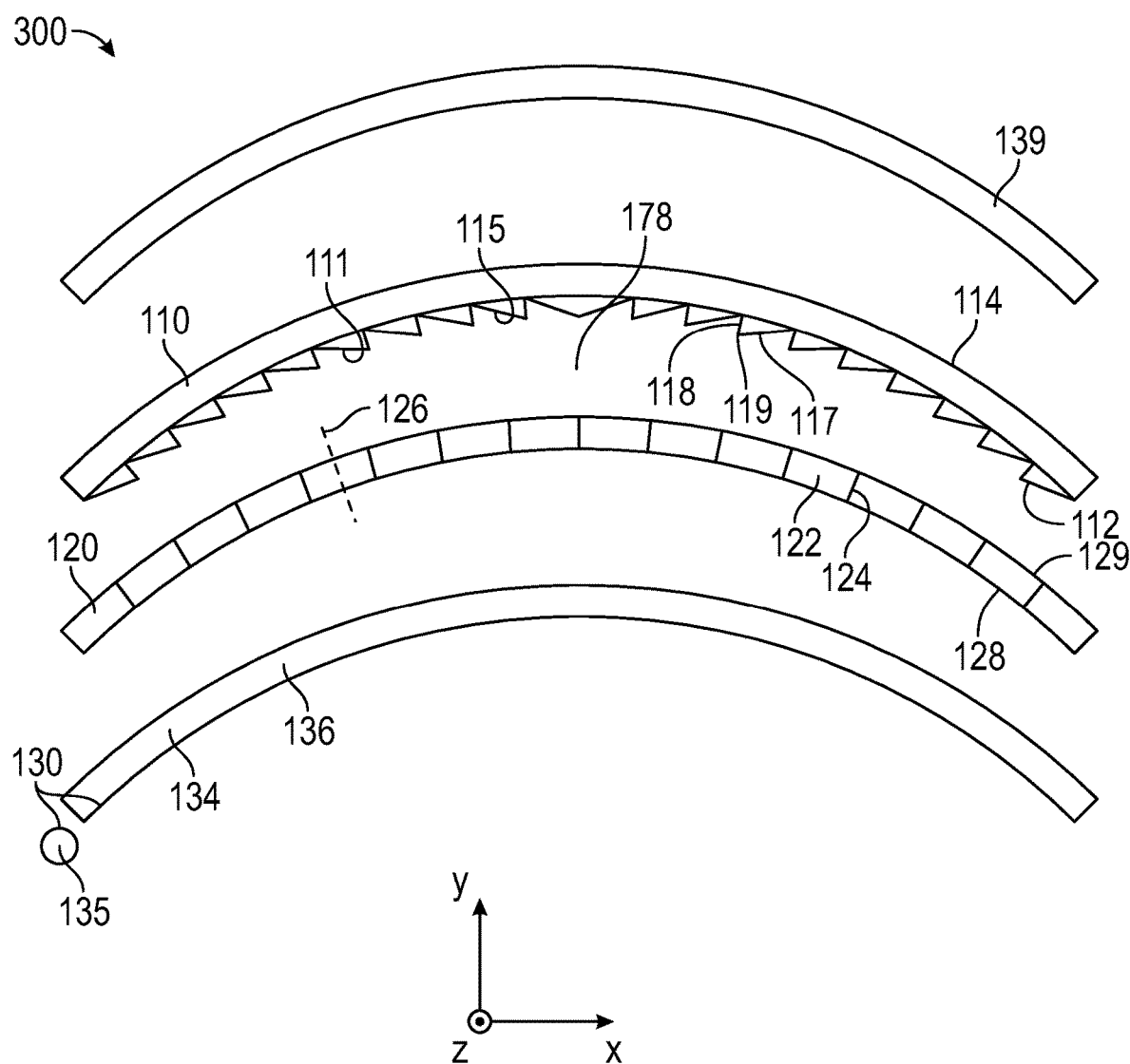

FIGS. 1-3 are schematic cross-sectional views of optical systems 100, 200, and 300, respectively. The optical system 100, 200, 300 includes an optical film 110 curved about a first axis (z-axis) and a light control film 120 curved about the first axis. The optical film 110 includes a microstructured first major surface 112 and an opposing second major surface 114. The microstructured first major surface 112 defines a linear Fresnel lens 111 including a plurality of Fresnel elements 115 extending longitudinally along the first axis. The light control film 120 can be disposed proximate the optical film 110 with the first major surface 112 of the optical film 110 facing the light control film 120. In some embodiments, the optical system includes a light source 130. The light control film 120 can be disposed between the light source 130 and the optical film 110 with the first major surface 112 of the optical film 110 facing the light control film 120. The light control film 120 includes a plurality of alternating optically transmissive 122 and optically absorptive 124 regions extending longitudinally along the first axis such that in a cross-section (x-y cross-section) orthogonal to the first axis, for at least a majority of the optically transmissive regions 122, a centerline 126 between adjacent optically absorptive regions is substantially normal (e.g., within 20 degrees, or within 10 degrees, or within 5 degrees of normal) to a major surface 128 and/or 129 of the light control film 120. The Fresnel lens 111 can be configured such that light 866 emitted from the light source 130 normal to an emission surface of the light source is redirected by the Fresnel lens in a substantially same redirected direction (y-direction).

A microstructured surface generally includes microstructures (e.g., the Fresnel elements 115 can be microstructures) where microstructures are structures having at least two orthogonal dimensions, such as a width and a height, less than 1 mm and greater than 100 nm). Microstructures can be formed in a polymeric layer. A polymeric layer is a layer including a continuous phase of organic polymer. A polymeric layer can also include inorganic nanoparticles dispersed in the continuous phase of organic polymer, for example. A polymeric microstructured layer can be formed on a substrate using a cast and cure process, as is known in the art (see, e.g., U.S. Pat. Appl. Pub. No. 2006/0114569 (Capaldo et al.) and U.S. Pat. No. 5,175,030 (Lu et al.) and U.S. Pat. No. 5,183,597 (Lu)). Other methods for making the polymeric structured layer include extrusion, machining, and embossing. Any suitable materials can be used. For example, an acrylate (e.g., polymethylmethacrylate) can be cast and cured onto a polyester (e.g., polyethylene terephthalate) substrate.

The light control film 120 can be any suitable light control film including those described in U.S. Pat. No. 8,213,082 (Gaides et al.); U.S. Pat. No. 9,335,449 (Gaides et al.); and U.S. Pat. No. 9,063,284 (Jones et al.), for example, and those described in International Pat. Appl. Pub. No. WO 2019/118685 (Schmidt et al.), for example.

In some embodiments (e.g., as illustrated for optical system 100), the light source 130 is or includes an organic light emitting diode (OLED) display 132 curved about the first axis. The display 132 can alternatively be another type of emissive display such as a micro-light emitting diode (microLED) display. In some embodiments (e.g., as illustrated for optical systems 200, 300), the light source 130 includes a backlight 134. In some embodiments, the backlight 134 includes a lightguide 136 curved about the first axis. In some embodiments, the light source 130 further includes one or more light emitting elements 135 (e.g., light emitting diode(s)). The backlight 134 can be a direct lit backlight or an edge lit backlight, for example. In some embodiments (e.g., as illustrated for optical system 200), the optical system can include a display panel 139 disposed between the backlight 134 and the light control film 120. In some embodiments (e.g., as illustrated for optical system 300), the optical system can include a display panel 139 where the optical film 110 is disposed between the display panel 139 and the light control film 120.

In some embodiments, an airgap 178 separates at least a majority of the first major surface 112 of the optical film 110 from the light control film 120. An airgap can be provided by not bonding the optical film 110 and the light control film 120 together, by bonding the films together only at one or more edges, or by using elongated spacer members to attach the films together, for example.

Figure 4:
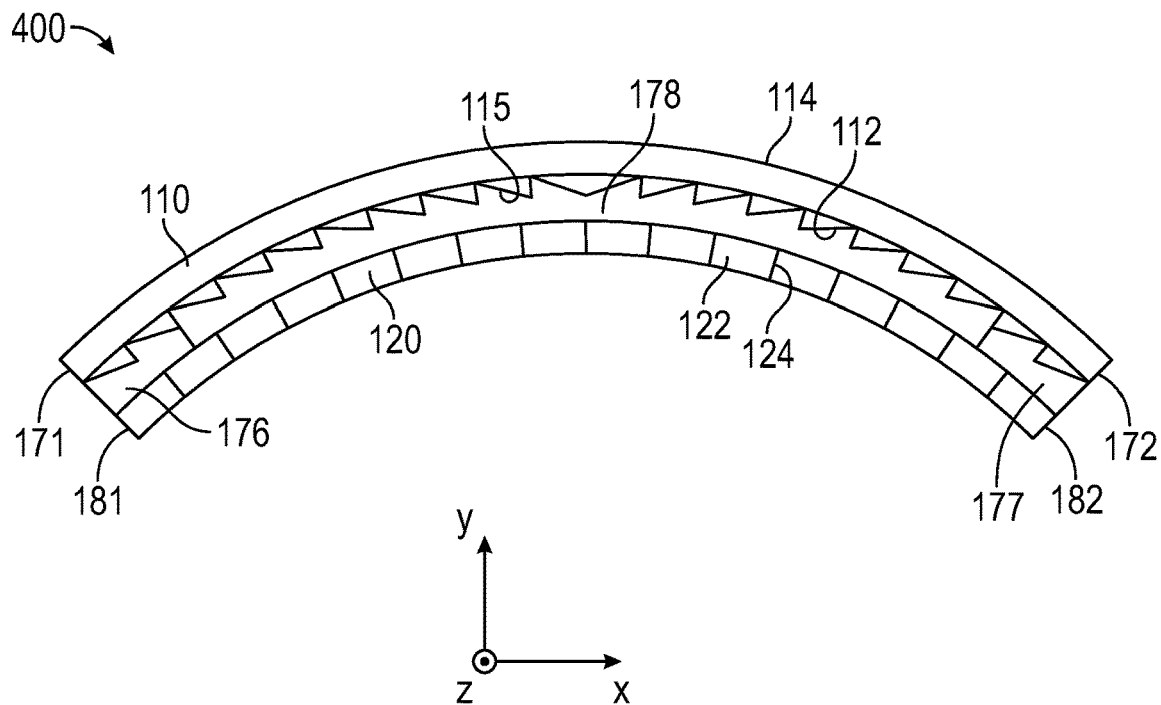
FIGS. 4-6 are schematic cross-sectional views of optical stacks that include an optical film and a light control film.

FIG. 4 is a schematic cross-sectional view of an optical system, or a portion of an optical system, including an optical stack 400 that includes the optical film 110 and the light control film 120. In some embodiments, the optical film 110 and the light control film 120 are taped (e.g., with tape 176 or 177) to one another along at least an edge 171 or 172 of the optical film 110 and corresponding edge 181 or 182, respectively, of the light control film. In some embodiments, the optical film 110 and the light control film 120 are taped to one another along at least two edges 171 and 172 of the optical film 110 and corresponding edges 181 and 182, respectively, of the light control film 120. Taped together along an edge should be understood to include tape being applied proximate the edge along at least a portion (e.g., at least a majority) of a length of the edge.

Figure 5:
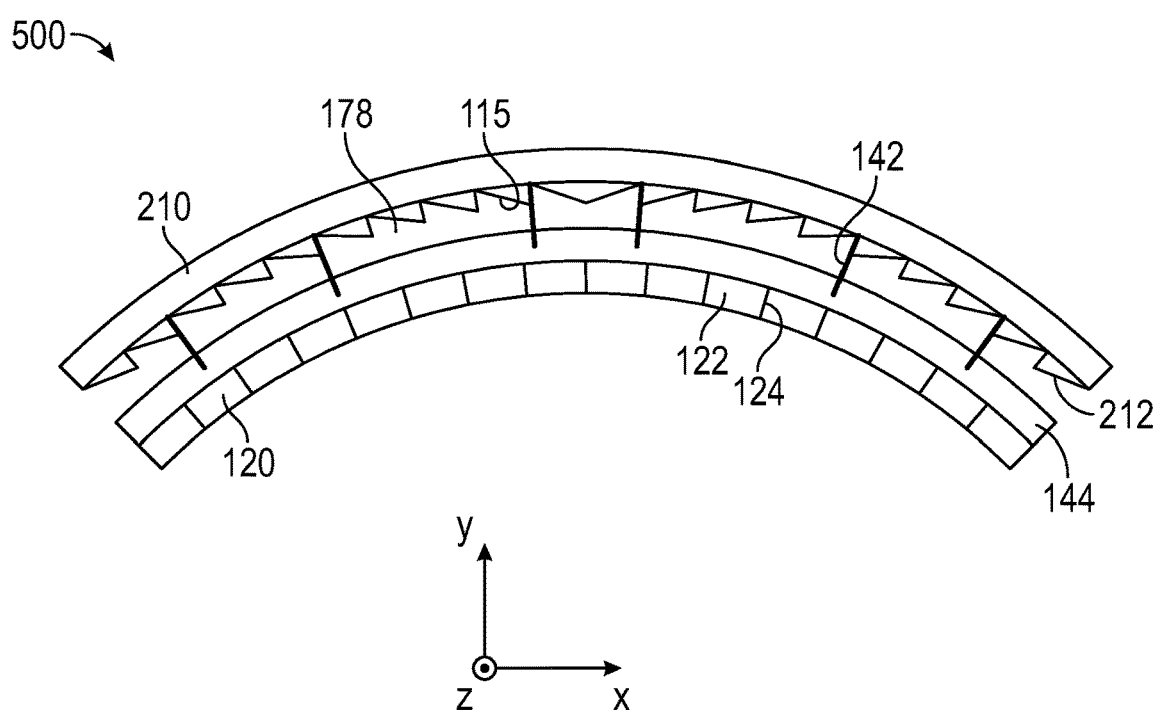

FIG. 5 is a schematic cross-sectional view of an optical system, or a portion of an optical system, including an optical stack 500 that includes an optical film 210 and the light control film 120. The optical film 210 may correspond to optical film 110 except that the first major surface 212 of the optical film 210 includes a plurality of elongated spacer members 142. In some embodiments, the first major surface 212 of the optical film 210 includes a plurality of elongated spacer members 142 extending toward the light control film 120 and being received by an adhesive layer 144 disposed on the light control film 120. The elongated spacer members 142 may be formed with the Fresnel elements 115 or may be deposited after the Fresnel elements 115 have been formed. The elongated spacer members 142 may also be referred to as optical decoupling structures and can have any of the geometries of the optical decoupling structures described in International Appl. Pub. No. WO 2019/135190 (Pham et al.), for example.

Figure 6:
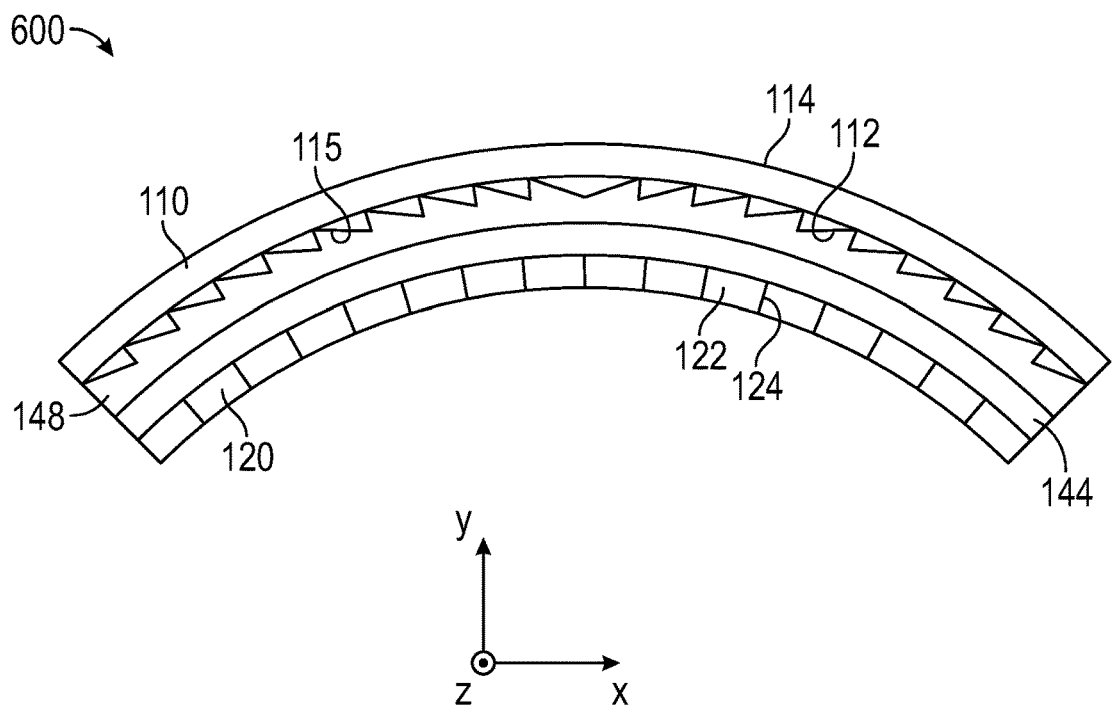

FIG. 6 is a schematic cross-sectional view of an optical system, or a portion of an optical system, including an optical stack 600 that includes the optical film 110 and the light control film 120. The optical system or optical stack 600 further includes a low index layer 148 disposed on and contacting at least a majority of the first major surface 112 of the optical film 110, and an optical adhesive 144 bonding the low index layer 148 to the light control film 120. In some embodiments, the low index layer 148 has a refractive index of no more than 1.45, or no more than 1.4, or no more than 1.35, or no more than 1.25, or no more than 1.2. For example, the refractive index of the low index layer 148 may be in a range of 1.05 to 1.45, or in a range of 1.1 to 1.35, or in a range of 1.1 to 1.25, or in a range of 1.05 to 1.2. The low index layer 148 can be a nanovoided polymeric layer as described in U.S. Pat. No. 8,808,811 (Kolb et al.), for example. In some embodiments, the low index layer 148 is an adhesive and the adhesive layer 144 is omitted.

The optical film 110, or the layer of the optical film 110 including the Fresnel elements 115, or the Fresnel elements, can have a refractive index greater than 1.5, or greater than 1.6, or greater than 1.7, for example.

In some embodiments, the optical film 110 and the light control film 120 are substantially concentric. For example, the optical film 110 can the light control film 120 can have substantially similar shapes and can be substantially coextensive with one another.

Figure 7:
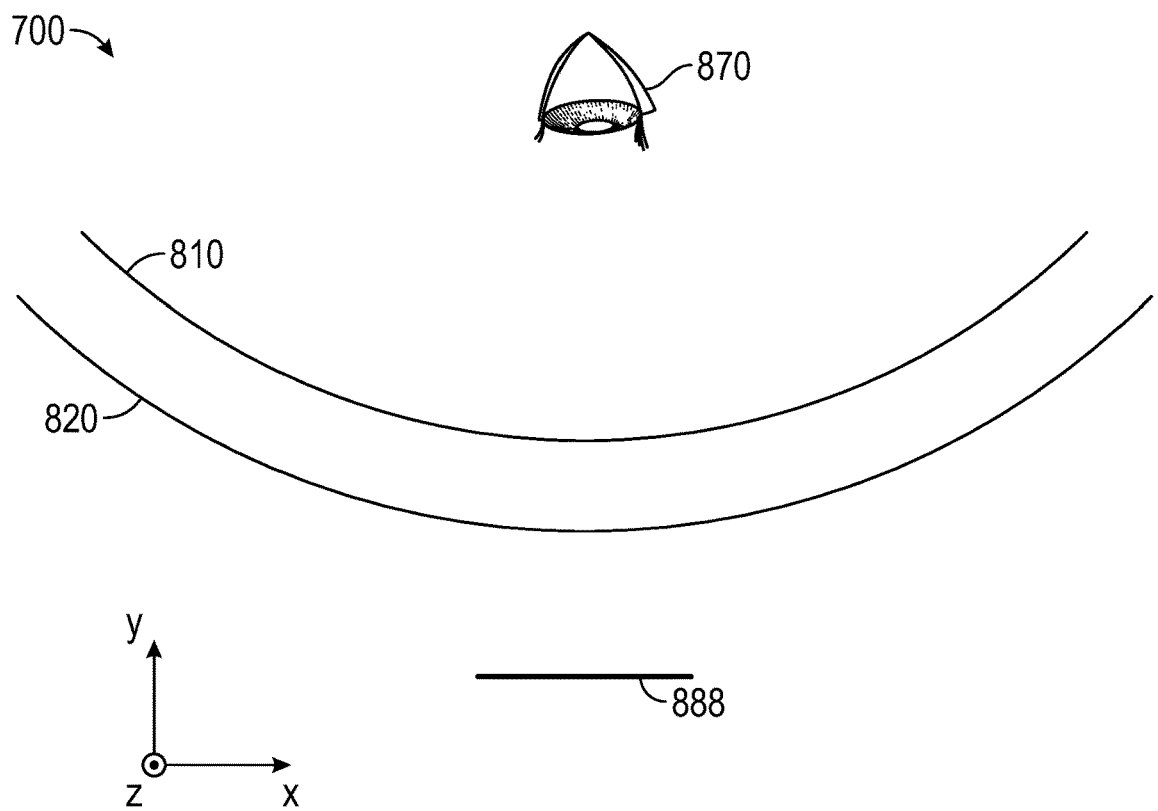
FIGS. 7-8 are schematic cross-sectional views of optical systems schematically illustrating shapes of optical films and light control films according to some embodiments.
Figure 8:
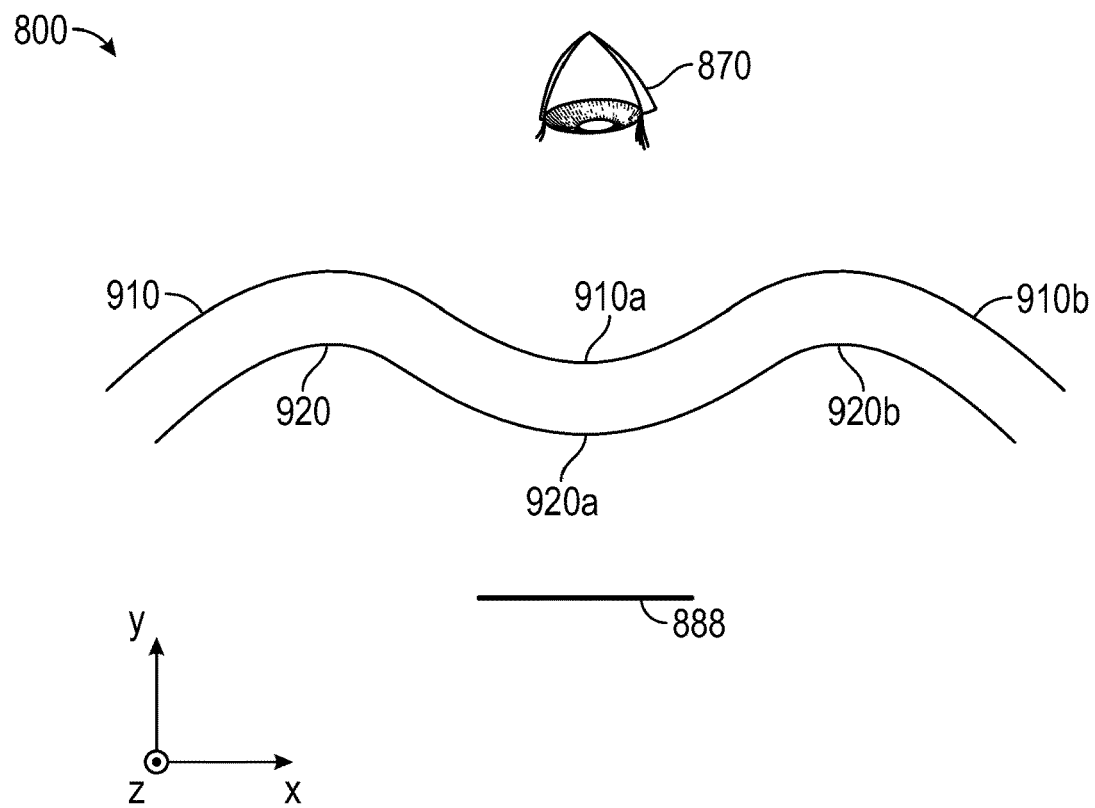

In some embodiments, the optical system (e.g., 100, 200, or 300) is adapted to display an image 888 to a viewer 870 (see, e.g., FIG. 1), where in the cross-section orthogonal to the first axis, the optical film 110 and the light control film 120 are each convex toward the viewer 870. The optical film 110 and light control film 120 can alternatively have different shapes as schematically illustrated in FIGS. 7-8. FIG. 7 is a schematic cross-sectional view of an optical system 700 include an optical film 810 (e.g., corresponding to optical film 110) and a light control film 820 (e.g., corresponding to light control film 120) and being adapted to display an image 888 to a viewer 870, where in the cross-section orthogonal to the first axis (z-axis), the optical film 810 and the light control film 820 are each concave toward the viewer 870. FIG. 8 is a schematic cross-sectional view of an optical system 800 including an optical film 910 (e.g., corresponding to optical film 110) and a light control film 920 (e.g., corresponding to light control film 120) and being adapted to display an image 888 to a viewer 870, where in the cross-section orthogonal to the first axis, a first portion (910a and 920a, respectively) of the each of the optical film 910 and the light control film 920 is concave toward the viewer 870 and a second portion (910b and 920b, respectively) of each of the optical film 910 and the light control film 920 is convex toward the viewer 870.

Figure 9:
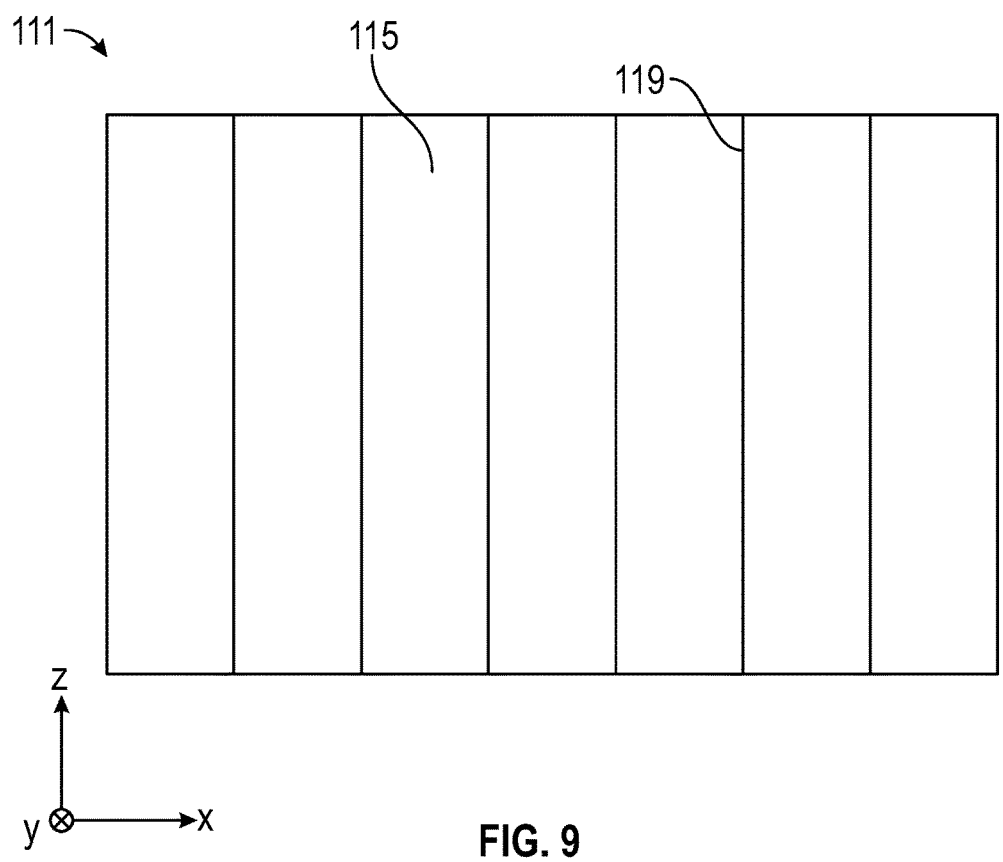
FIG. 9 is a schematic top view of a linear Fresnel lens.
Figure 10:
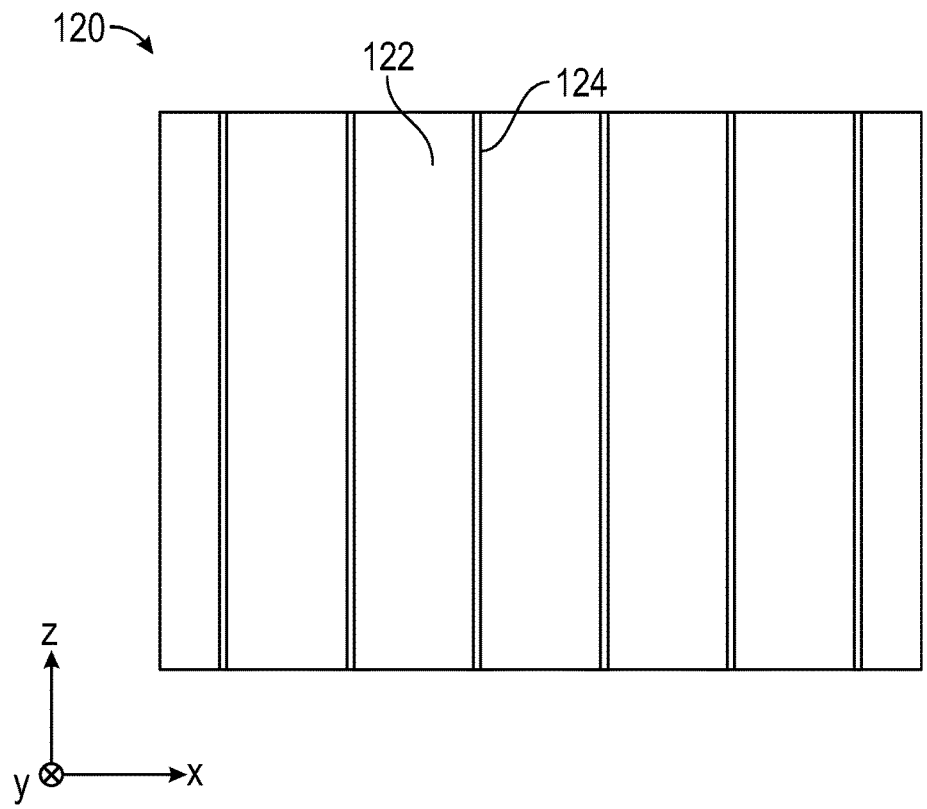
FIG. 10 is a schematic top view of a light control film.

In the embodiments schematically illustrated in FIGS. 1-10, the Fresnel elements of the optical film and/or the optically transmissive and absorptive regions of the light control film can extend along the first axis (z-axis). In some embodiments, the first major surface 112 of the optical film 110 defines a linear Fresnel lens 111 including Fresnel elements 115 extending longitudinally along the first axis (z-axis). FIG. 9 is a schematic top view (view facing the first major surface 112) of the linear Fresnel lens 111 when the optical film 110 is laid flat, according to some embodiments. FIG. 10 is a schematic top view of the light control film 120 when the light control film 120 is laid flat, according to some embodiments. In some embodiments, the light control film 120 includes a plurality of alternating optically transmissive regions 122 and optically absorptive regions 124 extending longitudinally along the first axis (z-axis).

In some embodiments, each Fresnel element 115 of optical film 110 includes an optical facet 117 and a sidewall 118 meeting the optical facet 117 at a ridge 119 of the Fresnel element. In some embodiments, each Fresnel element in at least a majority of the Fresnel elements 115 includes one or more of an at least partial coating (e.g., a conformal coating) of an inorganic optically transparent layer, an optically absorptive layer, a first layer disposed between and optically absorptive layer and the sidewall where the first layer can be less optically absorptive than the optically absorptive layer, and a second layer disposed on the optically absorptive layer opposite the sidewall where the second layer can be less optically absorptive than the optically absorptive layer and can be one or more of a protective layer or an antireflection layer.

Figure 11:
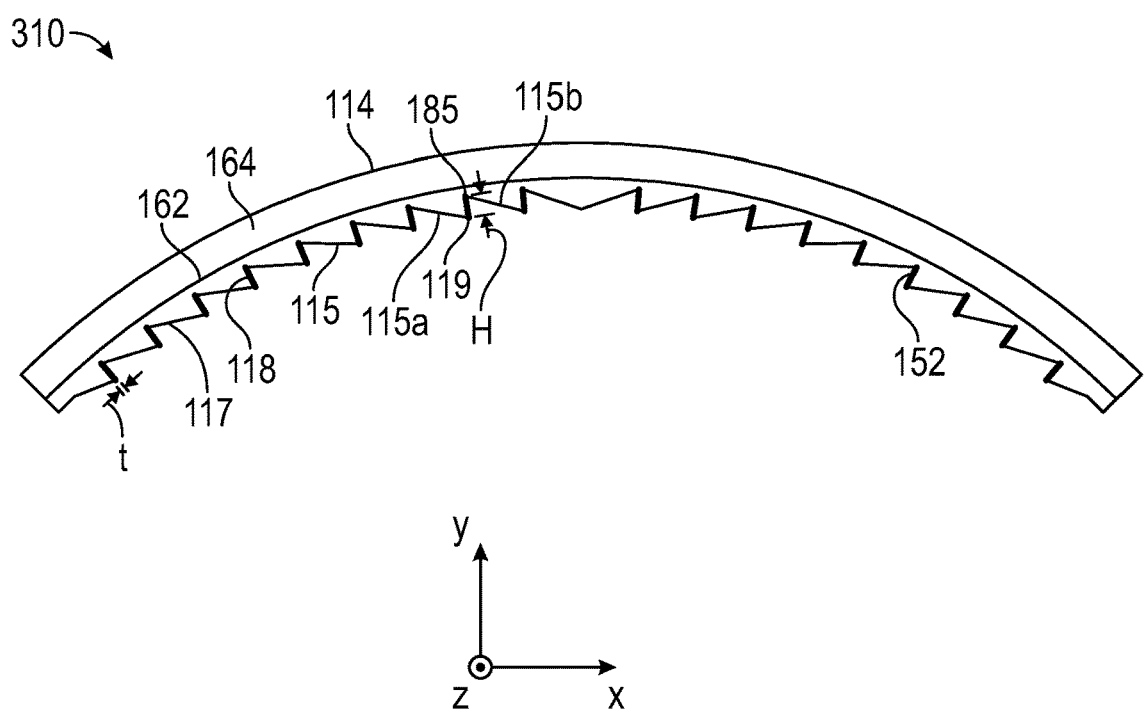
FIG. 11 is a schematic cross-sectional view of an optical film including a plurality of Fresnel elements.

FIG. 11 is a schematic cross-sectional view of an optical film 310 which may correspond to optical film 110. In some embodiments, each Fresnel element 115 includes an optical facet 117 and a sidewall 118 meeting the optical facet 117 at a ridge 119 of the Fresnel element. In some embodiments, for each Fresnel element in at least a majority of the Fresnel elements, an optically absorptive layer 152 is disposed on and substantially covers the sidewall 118. In some embodiments, the plurality of Fresnel elements includes a plurality of polymeric Fresnel elements 334 at least partially coated (e.g., conformally coated) with an inorganic optically transparent layer 157 (see, e.g., FIG. 13). In some embodiments, for each Fresnel element in at least a majority of the Fresnel elements, an optically absorptive layer 152 is disposed on and substantially covers the inorganic optically transparent layer 157 disposed on the sidewall 118.

As described further elsewhere herein, the inorganic optically transparent layer can be used as an etch stop in processes for removing the optically absorptive layer and/or other layers from the optical facets. Suitable materials for the inorganic optically transparent layer include a-Si, SiOx, SiAlOx, SiCyOx, $TiO_2$, and AlOx, for example. The layer can be sufficiently thin that greater than 60%, for example, of normally incident visible light is transmitted through the layer. A layer can be considered optically transparent if the layer has an average optical transmittance (unweighted mean over wavelength for unpolarized light) of visible light (wavelengths in a range of 400 nm to 700 nm) normally incident on the layer in air that is at least 60%. In some embodiments, the average optical transmittance of an inorganic optically transparent layer is greater than 60%, or greater than 70%, or greater than 80%, or greater than 85%, or greater than 90%.

In some embodiments, the optically absorptive layer 152 has an average thickness t where 100 nm<t<2 micrometers or 100 nm<t<1 micrometer. In some embodiments, the average thickness t is less than 500 nm. In some embodiments, for each Fresnel element 115a in at least the majority of the Fresnel elements 115, the sidewall 118 of the Fresnel element 115a has a height H from a base 185 of an adjacent Fresnel element 115b to the ridge 119 of the Fresnel element 115a, where H/t>10, or H/t>15, or H/t>18, or H/t>20.

In some embodiments (e.g., of optical film 110, 210, or 310), for each Fresnel element in at least the majority of the Fresnel elements, the sidewall 118 of the Fresnel element is substantially normal (e.g., within 30 degrees, or within 20 degrees, or within 10 degrees, or within 5 degrees of normal) to the second major surface 114. In some embodiments, the optical film 110, 210, or 310 includes a substrate 164 where the plurality of Fresnel elements 115 is formed on a major surface 162 of the substrate 164. In some embodiments, for each Fresnel element in at least the majority of the Fresnel elements, the sidewall 118 of the Fresnel element is substantially normal to the major surface 162 of the substrate 164. In some embodiments, the sidewall 118 makes an angle with the major surface 162 or with the major surface 114 or with a base of the Fresnel element in a range of 85 to 90 degrees or in other ranges described elsewhere herein.

Figure 12:
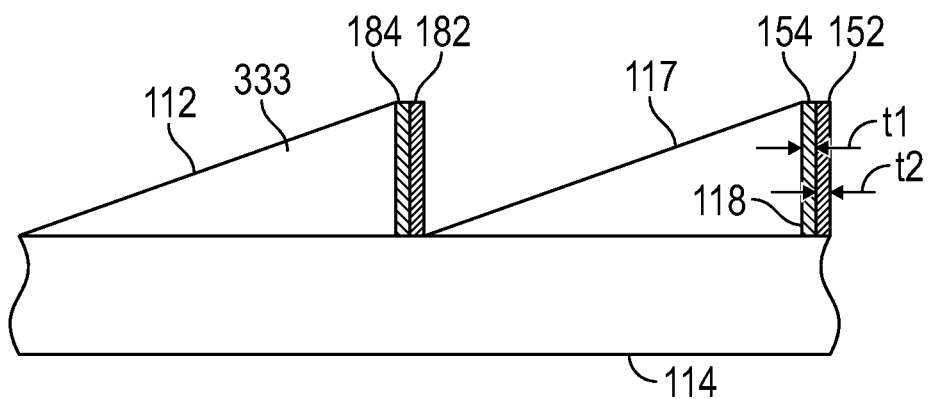
FIGS. 12-17 are schematic cross-sectional views of portions of optical films including a plurality of Fresnel elements.

FIG. 12 is a schematic cross-sectional view of a portion of an optical film (e.g., corresponding to optical film 110, 210, or 310). In some embodiments, for each Fresnel element 115 in at least the majority of the Fresnel elements, a first layer 154 is disposed between the sidewall 118 and the optically absorptive layer 152. The first layer 154, which may be referred to as a cladding layer, can be included to reduce reflection of light at an interface between the sidewall and the optically absorptive layer 152. In some embodiments, the first layer 154 has an extinction coefficient k1 and the optically absorptive layer 152 has an extinction coefficient k2. In some embodiments, k2>k1. In some embodiments, the plurality of Fresnel elements has an extinction coefficient k0<0.05. In some embodiments, k2>k1>k0. The extinction coefficient k0 can be understood to be the extinction coefficient of the material at the first major surface 112 defining the Fresnel element. In some embodiments, k2−k1 is greater than 0.05, 0.1, 0.15, or 0.2. In some embodiments, k2−k1 is less than 1, or less than 0.8, or less than 0.5 In some embodiments, k1−k0 is greater than 0.001, 0.005, or 0.01. In some embodiments, k1−k0 is less than 0.15, or less than 0.1, or less than 0.05. In some embodiments, k0 is less than 0.01, or less than 0.005, or less than 0.002. In some embodiments, k1 is in a range of 0.005 to 0.15, or 0.01 to 0.1. In some embodiments, k2 is in a range of 0.1 to 0.5, or 0.2 to 0.4. In some embodiments, k1<0.5 k2. In some embodiments, 0.005<k1<0.5 k2. Instead of, or in addition to, describing the first layer 154 and the optically absorptive layer 152 in terms of extinction coefficient, the layers can be described in terms of concentration of optically absorptive material as described further elsewhere herein.

In some embodiments, the optically absorptive layer 152 has a refractive index n1 and the first layer 154 has a refractive index n2, where |n1−n2| is less than 0.5, or less than 0.3, or less than 0.2, or less than 0.1.

The extinction coefficient can be expressed as the imaginary part of a complex index of refraction and the refractive index can be expressed as the real part of the complex index of refraction. The extinction coefficient and refractive index can be understood to be evaluated at a wavelength of 550 nm, except where indicated otherwise.

The extinction coefficient, k, of a thin film coating, for example, can be determined via either ellipsometry or spectroscopy, for example. k can be expressed as $\alpha\lambda/(4\pi)$ where $\alpha$ is the absorption coefficient and is the wavelength. For a thin film coating on a transparent substrate, spectroscopy can be used to measure the absorptance A as 100%−T−R, where T is transmittance and R is reflectance. The measured A can be appropriately corrected for the A of the substrate to obtain A of the thin film itself. The resulting A can then be used to determine a according to the equation $\alpha=-\ln[(100\%-A)/100\%]/h$ where h is the thickness of the thin film coating; this equation for a is an approximation used when R is relatively small, and A is relatively large. The thickness h can be measured, for example, by stylus profilometry or cross-sectional scanning electron microscopy.

The light absorbing material for the optically absorptive layer 152 and/or for the first layer 154 can be one or more of dyes, pigments, or particles (e.g., nanoparticles). Suitable light absorbing materials include carbon black nano-pigments and other nano-pigments such as those available from Cabot Corporation (Boston, MA) under the CAB-O-JET tradename. Other suitable light absorbing materials include those described in International Pat. Appl. Pub. No. WO 2019/118685 (Schmidt et al.).

In some embodiments, the first layer 154 has a concentration C1 of light absorbing material 184 and the optically absorptive layer 152 has a concentration C2 of light absorbing material 182, where C2>C1. In some embodiments, C1<0.7 C2, or C1<0.5 C2.

The concentration of light absorbing material (e.g., light absorbing nanoparticles) in the optically absorptive layer can be at least 10, 15, 20, 25, 30, 35, 40, 45, or 50 wt. % of the optically absorptive layer. In some embodiments, the concentration of light absorbing material in the optically absorptive layer is at least 55, 60, 65, 70, 75, 80, 85, 90 or 95 wt. % of the optically absorptive layer. In some embodiments, the concentration of light absorbing material in the optically absorptive layer is 100 wt. %. In some embodiments, the concentration of light absorbing material in the optically absorptive layer is 30-100 wt. % or 75-90 wt. % of the optically absorptive layer.

The concentration of light absorbing material in the first layer (cladding layer) is preferably less than the concentration of light absorbing material in the optically absorptive layer. The concentration of light absorbing material in the first layer is typically at least 0.5, 1, 5, 10, 15, 20, 25, 30, 35, 40 or 45 wt. % of the first layer. In some embodiments the concentration of light absorbing material in the first layer is no more than 20, 25, 30, 35, 40, 45, 50, 55, 60, 70, or 75 wt. % of the first layer. In some embodiments, the concentration of light absorbing material in the first layer is 0.5-50 wt. % or 25-45 wt. % of the first layer.

In some embodiments, the light control film 120 is as generally described in International Pat. Appl. Pub. No. WO 2019/118685 (Schmidt et al.), for example. In some such embodiments, the optically absorptive layer of the louvers includes an optically absorptive core layer and cladding layers on each side of the optically absorptive core layer. The optically absorptive core layer can be as described for the optically absorptive layer 152 and the cladding layers can be as described for the first layer 154. Using cladding layers can reduce the reflectivity of the louvers thereby reducing high angle light leakage and ghosting. Light control films including core and cladding layers are described in International Pat. Appl. No. IB2019/056489 (Schmidt et al.).

Figure 13:
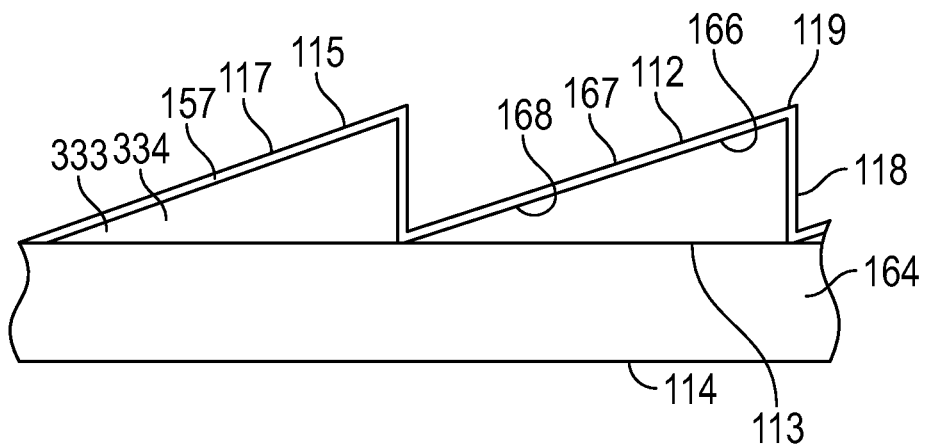
Figure 14:
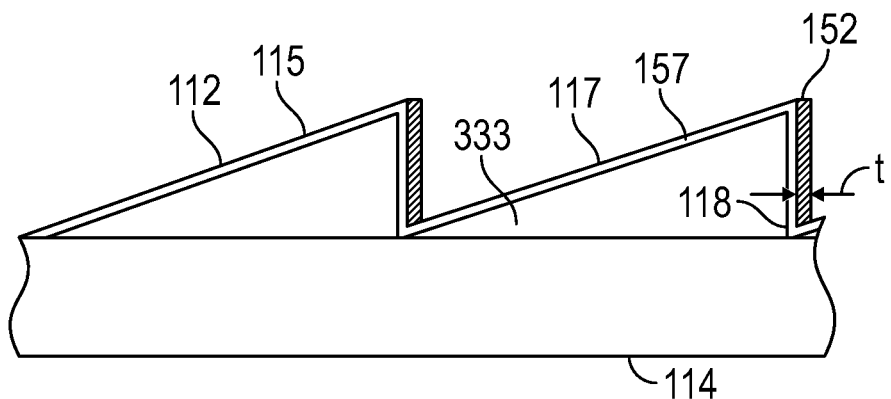
Figure 15:
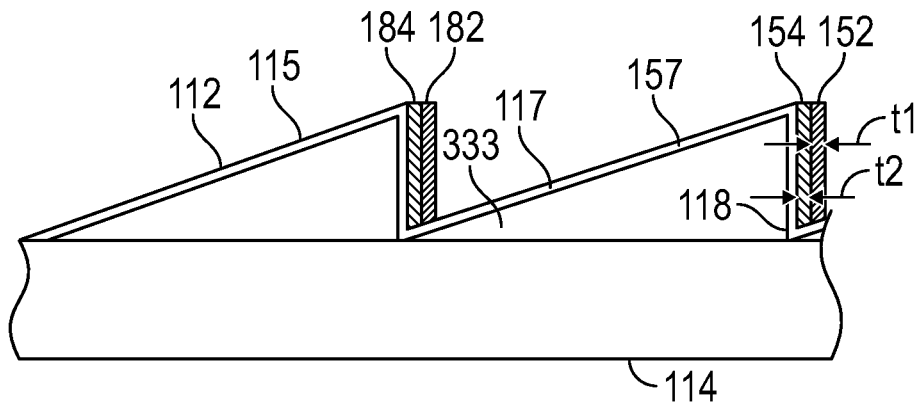
Figure 16:
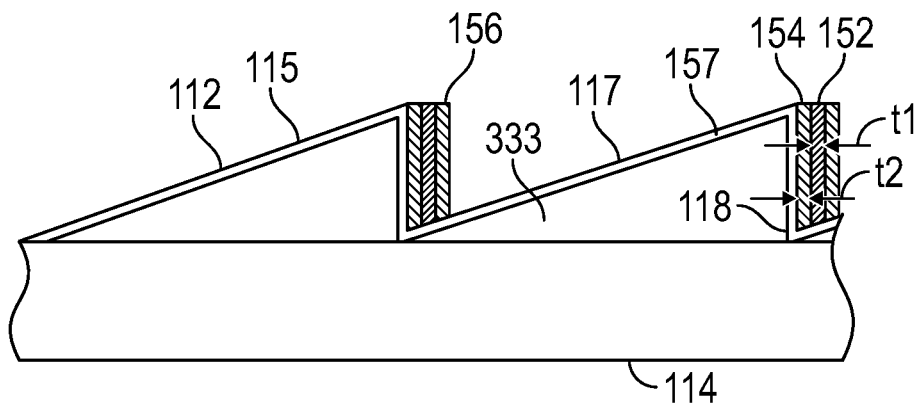

FIGS. 13-17 are schematic cross-sectional views of portions of an optical film (e.g., corresponding to optical film 110, 210, or 310). In some embodiments, as schematically illustrated in FIG. 13, for example, the plurality of Fresnel elements 115 includes a microstructured polymeric layer 333 conformally coated with an inorganic optically transparent layer 157. The inorganic optically transparent layer 157 can include opposing first 167 and second 166 major surfaces where the second major surface 166 faces the polymeric layer 333. The polymeric layer 333 has a major surface 113 facing the substrate layer 164. In some embodiments, as schematically illustrated in FIG. 14, for example, for each Fresnel element in at least a majority of the Fresnel elements 115, an optically absorptive layer 152 is disposed on and substantially covers the inorganic optically transparent layer 157 disposed on the sidewall 118. In some embodiments, as schematically illustrated in FIG. 15, for example, for each Fresnel element in at least the majority of the Fresnel elements 115, a first layer 154 is disposed between the sidewall 118 and the optically absorptive layer 152. In some embodiments, as schematically illustrated in FIG. 14, for example, the first layer 154 is omitted. In some embodiments, as schematically illustrated in FIG. 16, for example, for each Fresnel element in at least the majority of the Fresnel elements 115, a second layer 156 is disposed on the optically absorptive layer 152 opposite the sidewall 118 or opposite the first layer 154. The second layer 156 can be a protective layer and/or and antireflective layer, for example. The second layer can be as generally described for the first layer 154 (e.g., having an average thickness and/or extinction coefficient and/or concentration of optically absorptive material in the ranges described for the first layer 154). The inorganic optically transparent layer 157 may be optionally be omitted.

Figure 17:
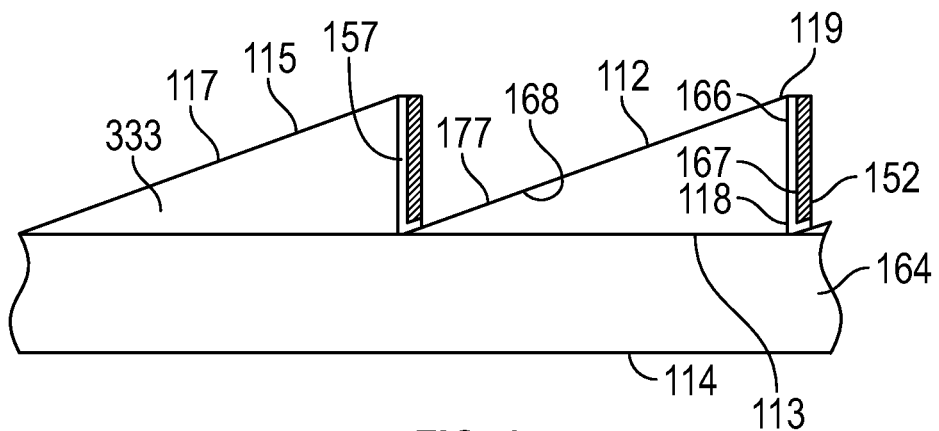

In some embodiments, as schematically illustrated in FIG. 17, for example, the microstructured surface 168 is only partially coated with the inorganic optically transparent layer 157 (e.g., only on the sidewalls). For example, the inorganically optically transparent layer can be conformally coated onto the microstructured surface 168 and then subsequently removed (or at least partially removed) from the optical facets. In any of the embodiments illustrated in FIGS. 13-16, the inorganic optically transparent layer 157 can optionally be removed or partially removed (e.g., a thin layer can remain) from the optical facets, for example. In some embodiments, the first major surface 112 of the optical film can include a major surface of the inorganic optically transparent layer 157 (e.g., the surfaces 167 of the plurality of sidewalls 118). In some embodiments, the Fresnel elements 115 of the at least partially coated microstructured surface can include optical facets that are a portion of the microstructured surface 168 of the polymeric layer 333 and can include sidewalls that are a portion of a major surface of the inorganic optically transparent layer 157. Alternatively, the Fresnel elements 115 can be considered to include optical facets and sidewalls that are portions of the microstructured surface 168 of the polymeric layer 333 and the inorganic optically transparent layer 157 can be considered to be a coating on the sidewall of the polymeric microstructure.

In some embodiments, an optical film includes a polymeric layer 333 including a microstructured surface 168 at least partially coated with an inorganic optically transparent layer 157. The at least partially coated microstructured surface 177 (which can include the optical facets 117 and the surface 167 of the inorganic optically transparent layer 157 on the sidewalls) includes a plurality of Fresnel elements 115. Each Fresnel element 115 includes an optical facet 117 and a sidewall 118 meeting the optical facet 117 at a ridge 119 of the Fresnel element 115. The optical facet 117 and the sidewall 118 can define an oblique angle therebetween. For each Fresnel element 115 in at least a majority of the Fresnel elements, an optically absorptive layer 152 is disposed on and substantially covers the sidewall 118.

In some embodiments, an optical film includes a polymeric layer 333 including a major surface 168 including a plurality of Fresnel elements. Each Fresnel element includes an optical facet (e.g., 117) and a sidewall (e.g., portion of major surface 168 facing the sidewall portion of the inorganic optically transparent layer 157) meeting the optical facet at a ridge of the Fresnel element. The optical facet and the sidewall can define an oblique angle therebetween. For each Fresnel element in at least a majority of the Fresnel elements: an inorganic optically transparent layer 157 is disposed on and substantially covers the sidewall; and an optically absorptive layer 152 is disposed on the inorganic optically transparent layer 157 opposite the sidewall where the optically absorptive layer 152 substantially covers the inorganic optically transparent layer 157.

In some embodiments, the inorganic optically transparent layer 157 can be provided on the sidewalls along with other layer(s) such as an optically absorptive layer as follows. The inorganically optically transparent layer can be conformally coated onto a microstructured polymeric layer, an optically absorptive layer (and optionally other layers) can be conformally coated onto the inorganic optically transparent layer, the optically absorptive layer (and optionally other layers) can be removed from the optical facets in a first etching step, then the inorganic optically transparent layer can be removed, or partially removed, from the optical facets in a second etching step. The first and second etching steps can utilize different etchants (e.g., an oxygen only plasma for the first etching step and a fluorinated gas or other halogenated gas for the second etching step), for example, in order to remove the desired layer(s) in the corresponding etching step.

In some embodiments, for each Fresnel element in at least the majority of the Fresnel elements 115, the first layer 154 has an average thickness t1, and the optically absorptive layer 152 has an average thickness t2. In some embodiments, t1 and t2 are each greater than 100 nm and less than 2 micrometers or less than 1 micrometer or less than 500 nm. In some embodiments, t1 and t2 are each less than 500 nm. In some embodiments, for each Fresnel element in at least the majority of the Fresnel elements 115, the sidewall 118 of the Fresnel element has a height H from a base of an adjacent Fresnel element to the ridge 119 of the Fresnel element. In some embodiments, H/t1>10, or H/t1>12, or H/t1>15, or H/t1>18, or H/t1>20. In some embodiments, H/t1<100. In some embodiments, H/t2>10, or H/t2>12, or H/t2>15, or H/t2>18, or H/t2>20. In some embodiments, H/t2<100. For example, in some embodiments, H/t1>15 and H/t2>15.

Figure 18:
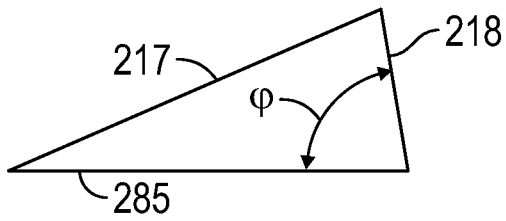
FIGS. 18-20 are schematic cross-sectional views of Fresnel elements.
Figure 19:
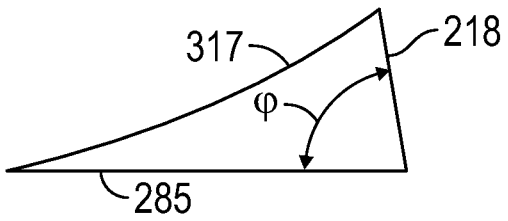
Figure 20:
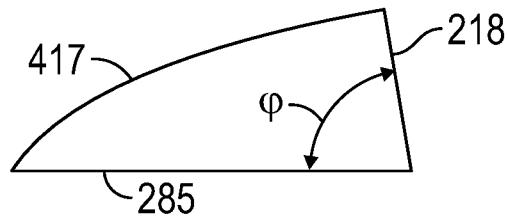

In some embodiments, for each Fresnel element in at least a majority of the Fresnel elements, the optical facet 117 is planar (e.g., as in typical conventional Fresnel lenses). FIG. 18 is a schematic illustration of a Fresnel element with a planar optical facet 217 where the sidewall 218 of the Fresnel element makes an angle φ with a base 285 of the Fresnel element. In other embodiments, for each Fresnel element in at least a majority of the Fresnel elements 115, the optical facet 117 is curved. For example, the facets can be curved to adjust various optical properties as described in U.S. Statutory Invention Registration No. H423 (Mohon et al.), for example. The optical facets 117 may be curved as schematically depicted in FIG. 19 for curved optical facet 317 (concave towards the sidewall 218 and/or towards the base 285 and/or towards the major surface 114 (see, e.g., FIG. 1)) or as schematically depicted in FIG. 20 for curved optical facet 417 (convex towards the sidewall 218 and/or towards the base 285 and/or towards the major surface 114), for example. The angle φ in FIGS. 18-20 may be in a range of 80 degrees to 90 degrees or 85 degrees to 90 degrees, for example. In some embodiments, φ is less than 90 degrees (e.g., 85 to 89.5 degrees) due to manufacturing constraints, for example.

Figure 21:
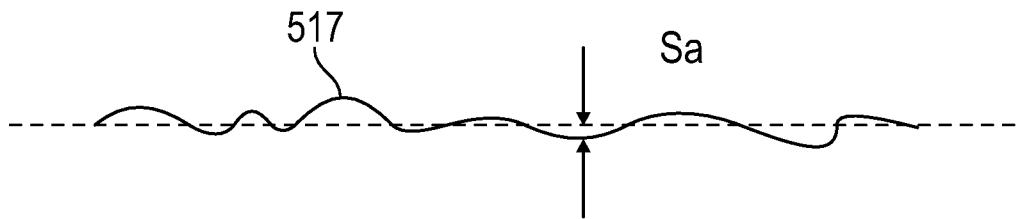
FIG. 21 is a schematic illustration of mean deviation surface roughness.

FIG. 21 is a schematic illustration of a mean deviation surface roughness Ra of a surface 517 which can be a surface of an optical facet. The mean deviation surface roughness Ra is the mean (e.g., mean over a length in a cross-section through the facet (e.g., in a cross-section orthogonal to a length of the facet) of the absolute value of the deviation of surface height from a mean surface height. In the case of a curved facet, the deviation in surface height can be defined relative to a mean or nominal curved surface. In some embodiments, for each Fresnel element in at least a majority of the Fresnel elements 115, the optical facet 117 has a mean deviation surface roughness Ra<250 nm. In some embodiments, Ra is less than 200 nm, 150 nm, 100 nm, 70 nm, 50 nm, 30 nm, or 20 nm. In some embodiments, Ra is greater than 50 nm, 70 nm, 90 nm. For example, in some embodiments, 50 nm<Ra<200 nm or 70 nm<Ra<200 nm. For some applications, it is desired for the optical facet 117 to be optically smooth (e.g., Ra<50 nm). For other applications, some degree of surface roughness may be desired (e.g., 50 nm<Ra<250 nm or 90 nm<Ra<200 nm). For example, it may be useful to have some degree of surface roughness for antireflection, for providing an (e.g., weak) optical diffusion, and/or for improving bonding. It has been found that using the processes described in International Pat. Appl. No. WO 2019/118685 (Schmidt et al.) to deposit and remove an optically absorptive layer from the sloped facets results in a surface roughness that is higher than desired (e.g., Ra greater than 300 nm or greater than 400 nm) for many applications, even though the same process applied to horizontal facets results in low surface roughness. However, it has been found that the surface roughness (e.g., Ra) can be reduced (e.g., to less than 250 nm or to less than 200 nm) by carefully controlling the time that the optical facet is exposed to plasma in a reactive ion etching process, for example. Further, it has been found that applying an inorganic optically transparent layer as an etch stop prior to applying the optically absorptive layer (and/or other layers) can further reduce the surface roughness and can result in optically smooth optical facets (e.g., Ra<50 nm) even with longer etch times. The root-mean-square surface roughness Rq can also be determined and can be in any of the ranges described for Ra.

The surface roughness can be determined from surface profiled measured via atomic force microscopy (AFM), stylus profilometry, or optical profilometry, for example. AFM is typically preferred for small surface roughness (e.g., less than 50 nm).

The inorganic optically transparent layer, the first layer (e.g., cladding layer), the optically absorptive layer, and/or the second layer (e.g., protective layer) can be deposited (e.g., as a conformal coating over an entire structured surface) using any suitable deposition technique. Various coating methods that can be used include, for example, layer-by-layer (LbL) coating, chemical vapor deposition (CVD), sputtering, reactive sputtering, and atomic layer deposition (ALD). At least some of the deposited layers (e.g., all of the layers, or all of the layers except the optional inorganic optically transparent layer) can subsequently be substantially removed from the optical facets (e.g., removed at least to the extent that any material from the at least some of the deposited layers remaining on the optical facets does not significantly affect optical performance).

In some embodiments, at least one of the first layer and the optically absorptive layer includes at least two bi-layers deposited by what is commonly referred to as a "layer-by-layer self-assembly process". This process is commonly used to assemble films or coatings of oppositely charged polyelectrolytes electrostatically, but other functionalities such as hydrogen bond donor/acceptors, metal ions/ligands, and covalent bonding moieties can be the driving force for film assembly. Some examples of suitable processes include those described in U.S. Pat. No. 8,234,998 (Krogman et al.,) and U.S. Pat. No. 8,313,798 (Nogueira et al.); in U.S. Pat. Appl. Pub. No. 2011/0064936 (Hammond-Cunningham et al.); and in International Pat. Appl. No. WO 2019/118685 (Schmidt et al.). Layer-by layer dip coating can be conducted using a StratoSequence VI (nanoStrata Inc., Tallahassee, FL) dip coating robot, for example.

In some embodiments, the plurality of bi-layers deposited by layer-by-layer self-assembly is a polyelectrolyte stack including an organic polymeric polyion (e.g., cation) and counterion (e.g., anion) including a light absorbing material (e.g., pigment). At least a portion of the cation layers, anion layers, or a combination thereof can include a light absorbing material (e.g., pigment) ionically bonded to the polyelectrolyte. A light absorbing compound can be dispersed within at least a portion of the polyelectrolyte layers. Various polyelectrolytes can be utilized including inorganic compounds, such as silica or silicate, as well as various phosphonocarboxylic acids and salts thereof (some of which are described in U.S. Pat. No. 10,365,415 (Schmidt)).

The thickness of a bi-layer and the number of bi-layers can be selected to achieve the desired optical properties (e.g., light absorption in the case of the optically absorptive layer, or reduced reflection between the sidewall and the optically absorptive layer in the case of the first layer). In some embodiments, the thickness of a bi-layer and/or the number of bi-layers are selected to achieve the desired optical properties using the minimum total thickness of self-assembled layers and/or the minimum number of layer-by-layer deposition steps. The thickness of each bi-layer typically ranges from about 5 nm to 350 nm. The number of bi-layers is typically at least 5, 6, 7, 8, 9, or 10. In some embodiments, the number of bilayers per stack is no greater than 150 or 100. It should be appreciated that individual bi-layers in the final article may not be distinguishable from each other by common methods in the art such as scanning electron microscopy (SEM) or transmission electron microscopy (TEM). In some embodiments, the thickness of the bi-layers and the total number of bi-layers are selected such that the total thickness of the first layer and the optically absorptive layer is less than 2 micrometers.

After applying and drying the optically absorptive layer and optionally the first and/or second layers and/or the inorganic optically transparent layer to the (e.g., entire) micro structured surface of the film, the optically absorptive layer and the first and second layer, when present, can then be removed from the optical facets and also removed from the land regions, if any, between adjacent Fresnel elements. The inorganic optically transparent layer, which can function as an etch stop, is typically not removed, but can optionally be removed in a subsequent etching step. Any suitable method can be used to selectively remove layer(s) from the optical facets. In some embodiments, layer(s) are removed by reactive ion etching Reactive ion etching (RIE) is a directional etching process utilizing ion bombardment to remove material. RIE systems are used to remove organic or inorganic material by etching surfaces in the direction of the ion bombardment. The most notable difference between reactive ion etching and isotropic plasma etching is the etch direction. Reactive ion etching is characterized by a ratio of the vertical etch rate to the lateral etch rate which is greater than 1. Systems for reactive ion etching are typically built around a durable vacuum chamber. Before beginning the etching process, the chamber is typically evacuated to a base pressure lower than 1 Torr, 100 mTorr, 20 mTorr, 10 mTorr, or 1 mTorr. Typically, an electrode holds the materials to be treated and is electrically isolated from the vacuum chamber. The electrode may be a rotatable electrode in a cylindrical shape. A counter electrode is typically also provided within the chamber and may include the vacuum reactor walls. Gas including an etchant typically enters the chamber through a control valve. The process pressure can be maintained by continuously evacuating chamber gases through a vacuum pump. The type of gas used varies depending on the etch process. Etchants can include on or more of oxygen, fluorinated gases, or other halogenated gases, for example. Carbon tetrafluoride ($CF_4$), sulfur hexafluoride ($SF_6$), octafluoropropane ($C_3F_8$), perfluorohexane ($C_6F_{14}$), fluoroform ($CHF_3$), boron trichloride ($BCl_3$), hydrogen bromide (HBr), nitrogen trifluoride ($NF_3$), chlorine, argon, and oxygen are commonly used for etching. Radio frequency (RF) power is applied to the electrode to generate a plasma. Reactive ion etching is known in the art and further described in U.S. Pat. No. 8,460,568 (David et al.) and in International Pat. Appl. No. WO 2019/118685 (Schmidt et al.), for example.

Samples can be conveyed on the electrode through plasma for a controlled time period to achieve a specified etch depth or to limit the etch so that the etch does not penetrate below the layer(s) desired to be removed. For example, if it is desired to remove an optically absorptive layer and the inorganic optically transparent layer is not included, the time period can be adjusted to minimize the time that the optical facets may be exposed to the plasma. This can reduce the surface roughness of the optical facets (e.g., such that Ra<250 nm) as described elsewhere.

In some embodiments, the optically absorptive layer (and/or other layers) are removed by laser ablation, e.g., pulsed laser ablation. Pulsed laser ablation (PLA) is a directional ablation process utilizing a photon flux to generate enough photon fluence to remove material through oxidation and/or sputtering. PLA systems are used to remove organic or inorganic material by etching surfaces in the direction of the photon fluence which can vaporize the target in the generation of a plasma plume. PLA is dependent on the wavelength of the laser, and the amount of absorption present at that wavelength in the light absorbing material. Absorption of the laser pulse generates energy for thermal, chemical, or mechanical evaporation, ablation, and/or plasma formation. The presence of oxidizing gas in the location of the laser pulse may change the amount of chemical oxidation occurring during the PLA process. The fluence can be changed by the optical configuration to change the size and location of the focal spot and by the power setpoints of laser systems. The relative orientation of the laser fluence and the sample can allow one skilled in the art to ablate optically absorptive layers coated on a structured surface at oblique angles.

Examples of optical films including microstructures that each have an optical facet and a sidewall meeting the optical facet at a ridge of the microstructure where an optically absorptive layer is disposed on the sidewall but not on the optical facet are described in U.S. Appl. No. 62/932,578 filed on Nov. 8, 2019 and titled "OPTICAL FILM".

The following is a list of illustrative embodiments of the present description.

A first embodiment is an optical system comprising:
a light source;
an optical film curved about a first axis and comprising a microstructured first major surface and an opposing second major surface, the microstructured first major surface defining a linear Fresnel lens comprising a plurality of Fresnel elements extending longitudinally along the first axis; and
a light control film curved about the first axis and disposed between the light source and the optical film, the first major surface of the optical film facing the light control film, the light control film comprising a plurality of alternating optically transmissive and optically absorptive regions extending longitudinally along the first axis such that in a cross-section orthogonal to the first axis, for at least a majority of the optically transmissive regions, a centerline between adjacent optically absorptive regions is substantially normal to a major surface of the light control film.

A second embodiment is the optical system of the first embodiment, wherein the light source comprises a backlight.

A third embodiment is the optical system of the second embodiment, wherein the backlight comprises a light guide curved about the first axis.

A fourth embodiment is the optical system of the second or third embodiments further comprising a display panel disposed between the backlight and the light control film.

A fifth embodiment is the optical system of any one of the first through third embodiments further comprising a display panel, the optical film disposed between the display panel and the light control film.

A sixth embodiment is the optical system of the first embodiment, wherein the light source comprises an organic light emitting diode (OLED) display curved about the first axis.

A seventh embodiment is the optical system of any one of the first through sixth embodiments, wherein the plurality of Fresnel elements comprises a plurality of polymeric Fresnel elements at least partially coated with an inorganic optically transparent layer.

An eighth embodiment is the optical system of the seventh embodiment, wherein each Fresnel element comprises an optical facet and a sidewall meeting the optical facet at a ridge of the Fresnel element, wherein for each Fresnel element in at least a majority of the Fresnel elements, an optically absorptive layer is disposed on and substantially covers the inorganic optically transparent layer disposed on the sidewall.

A ninth embodiment is the optical system of any one of the first through eighth embodiments, wherein an airgap separates at least a majority of the first major surface of the optical film from the light control film.

A tenth embodiment is the optical system of any one of the first through ninth embodiments, wherein the optical film and the light control film are taped to one another along at least an edge of the optical film and corresponding edge of the light control film.

An eleventh embodiment is the optical system of any one of the first through ninth embodiments, wherein the first major surface of the optical film comprises a plurality of elongated spacer members extending toward the light control film and being received by an adhesive layer disposed on the light control film.

A twelfth embodiment is the optical system of any one of the first through ninth embodiments, further comprising:
a low index layer disposed on and contacting at least a majority of the first major surface of the optical film, the low index layer having a refractive index of no more than 1.45; and
an optical adhesive bonding the low index layer to the light control film.

A thirteenth embodiment is an optical system comprising:
an optical film curved about a first axis and comprising a microstructured first major surface and an opposing second major surface, the microstructured first major surface defining a linear Fresnel lens comprising a plurality of Fresnel elements extending longitudinally along the first axis, each Fresnel element comprising an optical facet and a sidewall meeting the optical facet at a ridge of the Fresnel element, wherein for each Fresnel element in at least a majority of the Fresnel elements, an optically absorptive layer is disposed on and substantially covers the sidewall, the optically absorptive layer having an average thickness t, 100 nm<t<1 micrometer;
a light control film curved about the first axis and disposed proximate the optical film, the first major surface of the optical film facing the light control film, the light control film comprising a plurality of alternating optically transmissive and optically absorptive regions extending longitudinally along the first axis such that in a cross-section orthogonal to the first axis, for at least a majority of the optically transmissive regions, a centerline between adjacent optically absorptive regions is substantially normal to a major surface of the light control film.

A fourteenth embodiment is the optical system of the thirteenth embodiment, wherein for each Fresnel element in at least the majority of the Fresnel elements, the sidewall of the Fresnel element has a height H from a base of an adjacent Fresnel element to the ridge of the Fresnel element, H/t>15.

A fifteenth embodiment is the optical system of the thirteenth or fourteenth embodiments, wherein the plurality of Fresnel elements has an extinction coefficient k0<0.05, and wherein for each Fresnel element in at least the majority of the Fresnel elements, a first layer is disposed between the sidewall and the optically absorptive layer, the first layer having an extinction coefficient k1>k0, the optically absorptive layer having an extinction coefficient k2, wherein k2−k1>0.05.

EXAMPLES

Figure 22:
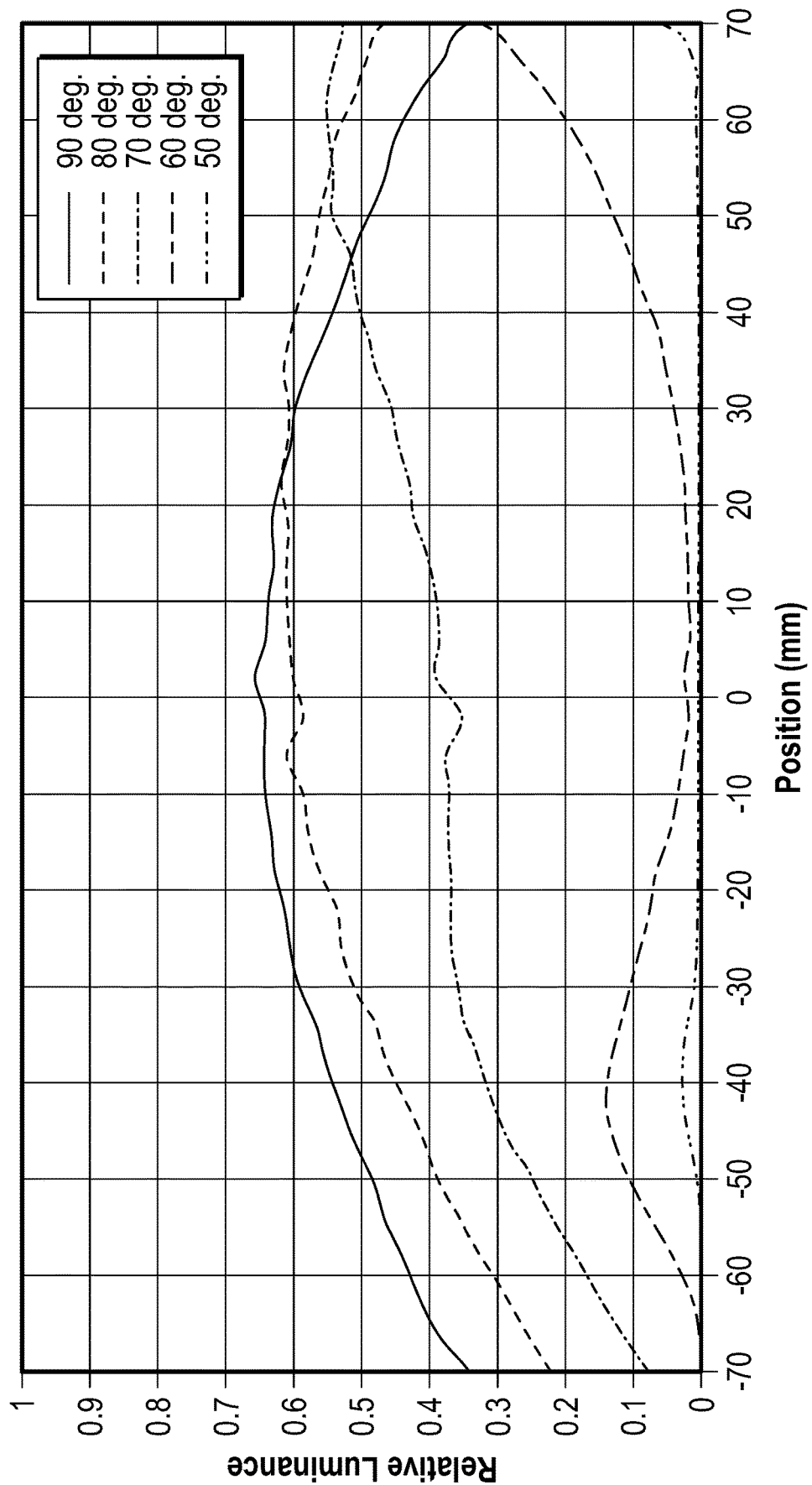
FIGS. 22-24 are plots of relative luminance versus position for various view angles.
Figure 23:
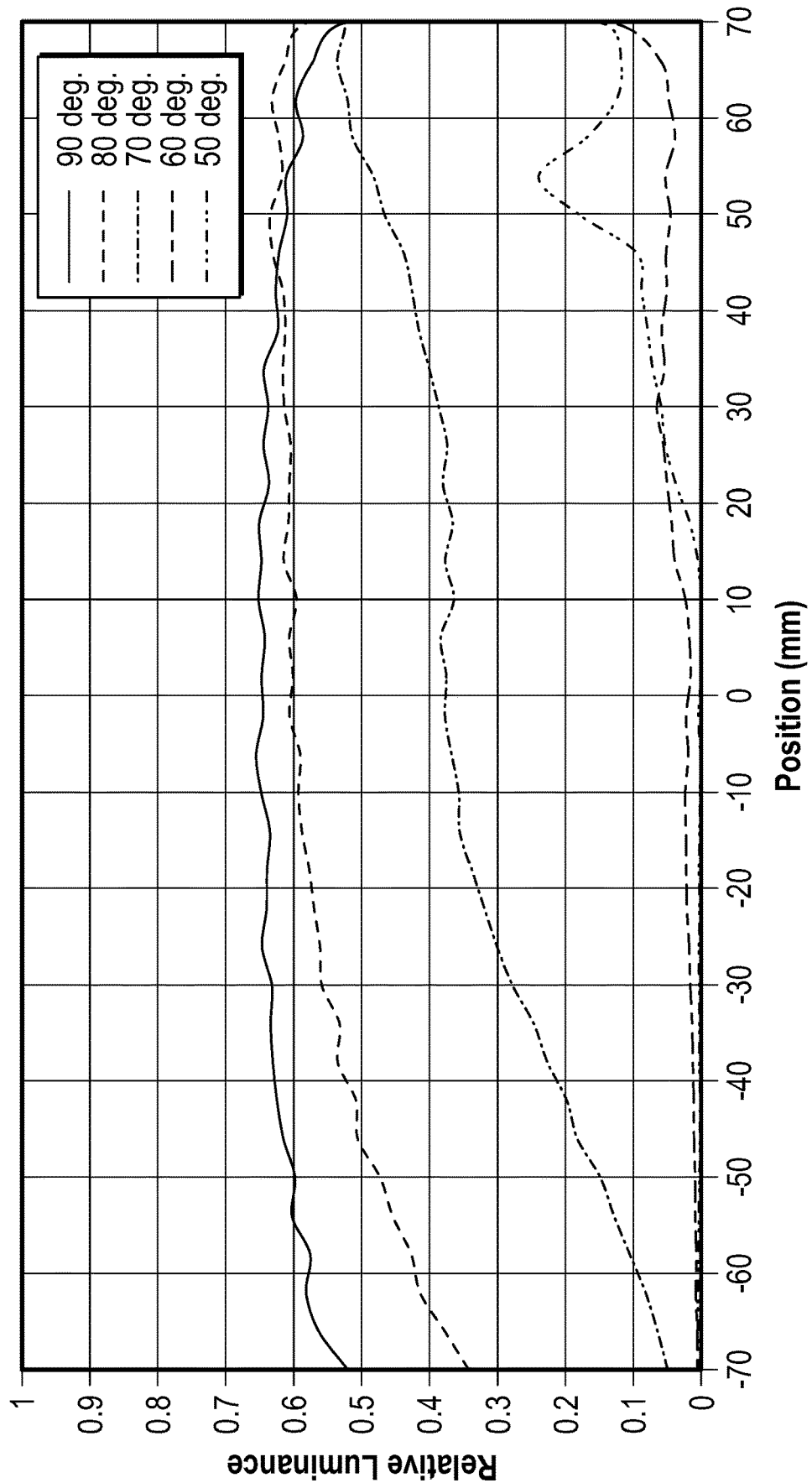
Figure 24:
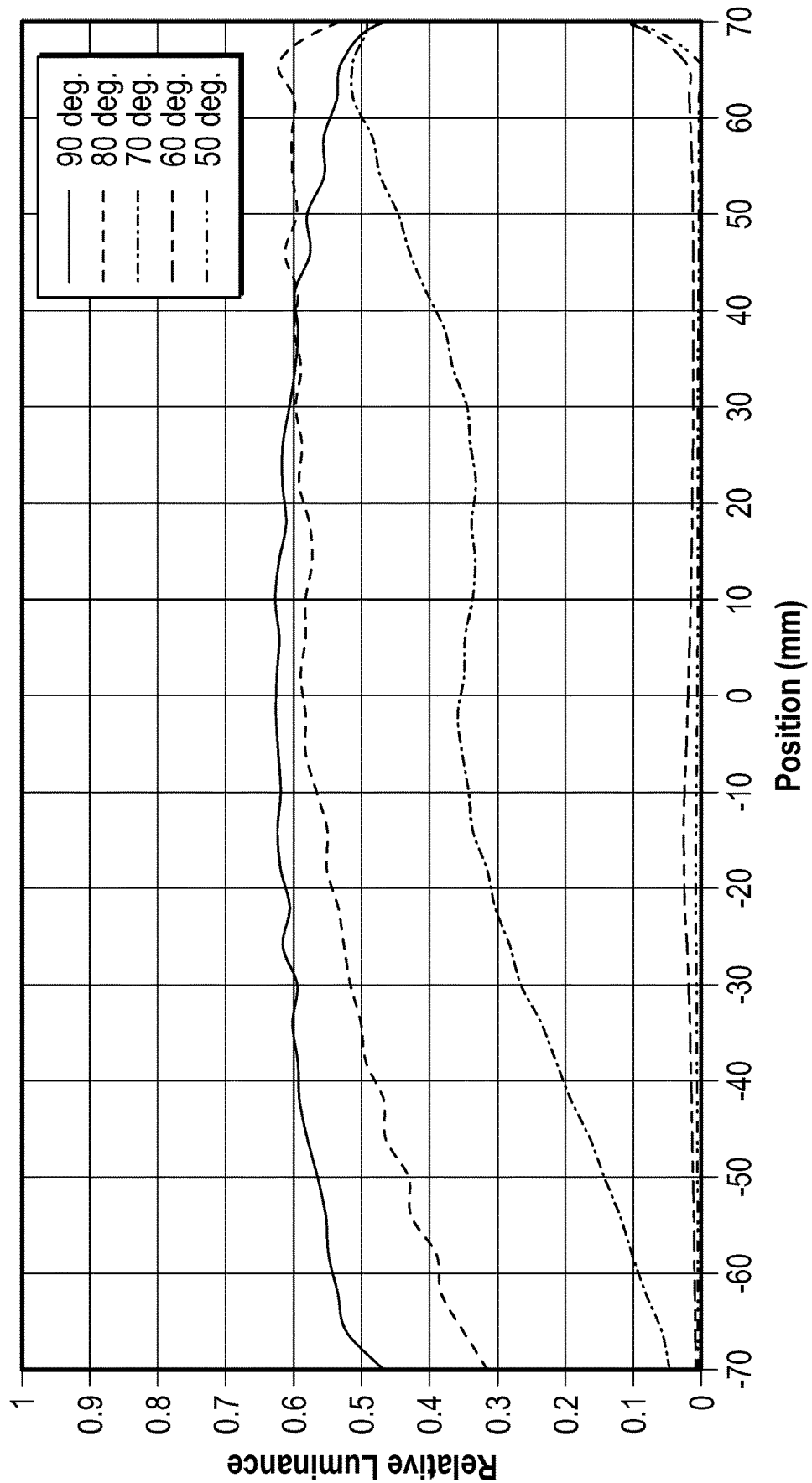

Optical modeling was carried out for an optical system as generally depicted in FIG. 1 and for a comparative optical system where the Fresnel lens was disposed on the light control film with the Fresnel facets facing away from the light source 130. The light source surface was taken to have a parabolic shape in cross-sections orthogonal to the z-axis where the shape was given by y=½ 0.00645 $x^2$ with y and x in mm, referring to the x-y-z coordinate system of FIG. 1. The radius of curvature at x=0 was about 155 mm. The Fresnel lens was designed such that a light ray emitted normal to the light source surface was refracted by the Fresnel lens into the y-direction. The Luminance distribution was calculated for various view angles (90 degrees is on-axis) and for various positions along the light source surface (x-coordinate). FIG. 22 shows the results for the comparative optical system. FIG. 23 shows the results for the optical system of FIG. 1 without an optically absorptive layer on the sidewalls. FIG. 24 shows the results for the optical system of FIG. 1 with an optically absorptive layer on the sidewalls (e.g., as illustrated in FIG. 11). The comparative optical system showed a bright band for view angles around 60 degrees and for x-coordinates around −40 mm. This bright band was substantially eliminated in the optical system of FIGS. 1 and 23. However, there was light leakage for view angles around 50 degrees and for x-coordinates around 55 mm which may be objectionable in some applications. This light leakage was substantially eliminated by including the optically absorptive layer on the sidewalls as shown in FIG. 24.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. An optical system comprising:
a light source;
an optical film curved about a first axis and comprising a microstructured first major surface and an opposing second major surface, the microstructured first major surface defining a linear Fresnel lens comprising a plurality of Fresnel elements extending longitudinally along the first axis; and
a light control film curved about the first axis and disposed between the light source and the optical film, the first major surface of the optical film facing the light control film, the light control film comprising a plurality of alternating optically transmissive and optically absorptive regions extending longitudinally along the first axis such that in a cross-section orthogonal to the first axis, for at least a majority of the optically transmissive regions, a centerline between adjacent optically absorptive regions is substantially normal to a major surface of the light control film.

2. The optical system of claim 1, wherein the light source comprises a backlight.

3. The optical system of claim 2, wherein the backlight comprises a light guide curved about the first axis.

4. The optical system of claim 2 further comprising a display panel disposed between the backlight and the light control film.

5. The optical system of claim 1 further comprising a display panel, the optical film disposed between the display panel and the light control film.

6. The optical system of claim 1, wherein the light source comprises an organic light emitting diode (OLED) display curved about the first axis.

7. The optical system of claim 1, wherein the plurality of Fresnel elements comprises a plurality of polymeric Fresnel elements at least partially coated with an inorganic optically transparent layer.

8. The optical system of claim 7, wherein each Fresnel element comprises an optical facet and a sidewall meeting the optical facet at a ridge of the Fresnel element, wherein for each Fresnel element in at least a majority of the Fresnel elements, an optically absorptive layer is disposed on and substantially covers the inorganic optically transparent layer disposed on the sidewall.

9. The optical system of claim 1, wherein an airgap separates at least a majority of the first major surface of the optical film from the light control film.

10. The optical system of claim 1, wherein the optical film and the light control film are taped to one another along at least an edge of the optical film and corresponding edge of the light control film.

11. The optical system of claim 1, wherein the first major surface of the optical film comprises a plurality of elongated spacer members extending toward the light control film and being received by an adhesive layer disposed on the light control film.

12. The optical system of claim 1, further comprising:
a low index layer disposed on and contacting at least a majority of the first major surface of the optical film, the low index layer having a refractive index of no more than 1.45; and
an optical adhesive bonding the low index layer to the light control film.

13. An optical system comprising:
an optical film curved about a first axis and comprising a microstructured first major surface and an opposing second major surface, the microstructured first major surface defining a linear Fresnel lens comprising a plurality of Fresnel elements extending longitudinally along the first axis, each Fresnel element comprising an optical facet and a sidewall meeting the optical facet at a ridge of the Fresnel element, wherein for each Fresnel element in at least a majority of the Fresnel elements, an optically absorptive layer is disposed on and substantially covers the sidewall, the optically absorptive layer having an average thickness t, 100 nm<t<1 micrometer;

a light control film curved about the first axis and disposed proximate the optical film, the first major surface of the optical film facing the light control film, the light control film comprising a plurality of alternating optically transmissive and optically absorptive regions extending longitudinally along the first axis such that in a cross-section orthogonal to the first axis, for at least a majority of the optically transmissive regions, a centerline between adjacent optically absorptive regions is substantially normal to a major surface of the light control film.

14. The optical system of claim 13, wherein for each Fresnel element in at least the majority of the Fresnel elements, the sidewall of the Fresnel element has a height H from a base of an adjacent Fresnel element to the ridge of the Fresnel element, H/t>15.

15. The optical system of claim 13, wherein the plurality of Fresnel elements has an extinction coefficient k0<0.05, and wherein for each Fresnel element in at least the majority of the Fresnel elements, a first layer is disposed between the sidewall and the optically absorptive layer, the first layer having an extinction coefficient k1>k0, the optically absorptive layer having an extinction coefficient k2, wherein k2−k1>0.05.

* * * * *